United States Patent
Tan et al.

(10) Patent No.: US 11,765,850 B2
(45) Date of Patent: Sep. 19, 2023

(54) ASSISTANT INSTALLATION DEVICE

(71) Applicant: Wistron Corporation, New Taipei (TW)

(72) Inventors: Siyun Tan, New Taipei (TW); Yisheng Chen, New Taipei (TW)

(73) Assignee: Wistron Corporation, New Taipei (TW)

(*) Notice: Subject to any disclaimer, the term of this patent is extended or adjusted under 35 U.S.C. 154(b) by 0 days.

(21) Appl. No.: 17/519,558

(22) Filed: Nov. 4, 2021

(65) Prior Publication Data

US 2023/0085091 A1   Mar. 16, 2023

(30) Foreign Application Priority Data

Sep. 10, 2021 (CN) .......................... 202111063278.X

(51) Int. Cl.
*H05K 7/14* (2006.01)
(52) U.S. Cl.
CPC .................................. *H05K 7/1489* (2013.01)
(58) Field of Classification Search
CPC .................................................... H05K 7/1489
See application file for complete search history.

(56) References Cited

U.S. PATENT DOCUMENTS

| | | | | |
|---|---|---|---|---|
| 6,953,232 B2* | 10/2005 | Busby | .................. | H05K 7/1409 |
| | | | | 292/196 |
| 7,126,817 B2* | 10/2006 | Li | ............................ | G06F 1/184 |
| 7,639,488 B2* | 12/2009 | Tu | ............................ | G06F 1/187 |
| | | | | 248/618 |
| 8,339,778 B2* | 12/2012 | Hughes | .................... | G06F 1/187 |
| | | | | 361/679.33 |
| 11,026,343 B1* | 6/2021 | Telefus | ................. | H05K 7/2039 |
| 11,171,450 B2* | 11/2021 | Sassano | ........... | H01R 13/62977 |
| 2002/0075787 A1* | 6/2002 | Inoue | .................... | G11B 21/025 |
| | | | | 720/675 |
| 2021/0013676 A1* | 1/2021 | Sassano | ............... | H05K 7/1489 |

* cited by examiner

*Primary Examiner* — Minh N Trinh
(74) *Attorney, Agent, or Firm* — JCIPRNET

(57) ABSTRACT

An assistant installation device, including a base, a carrier, and a handle, is provided. The base is adapted to be placed on a first object. The carrier is slidably disposed on the base and is adapted to carry a second object. The handle is connected to the base and the carrier. The handle is adapted to drive the carrier to move relative to the base, so that an assembling portion of the second object corresponds to an assembling portion of the first object.

11 Claims, 20 Drawing Sheets

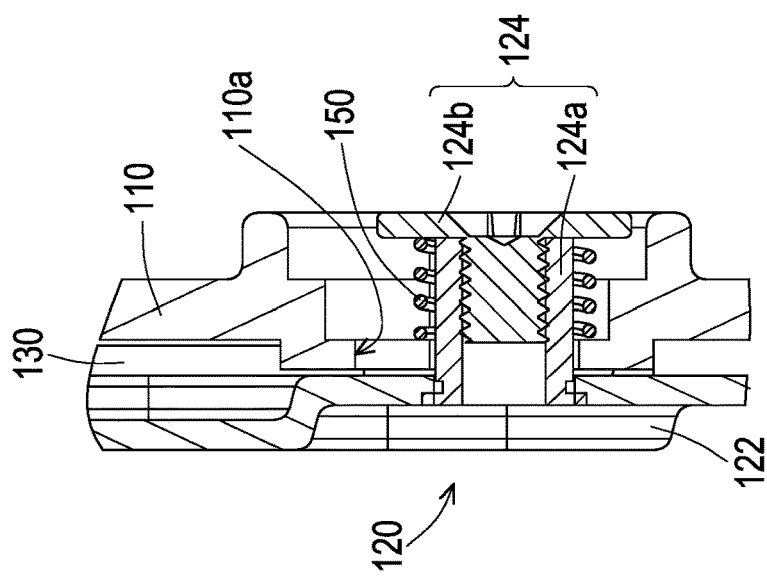
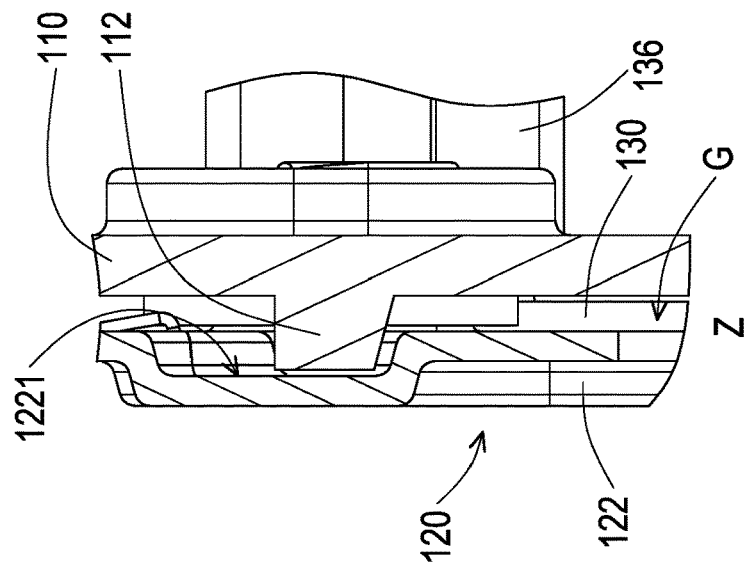
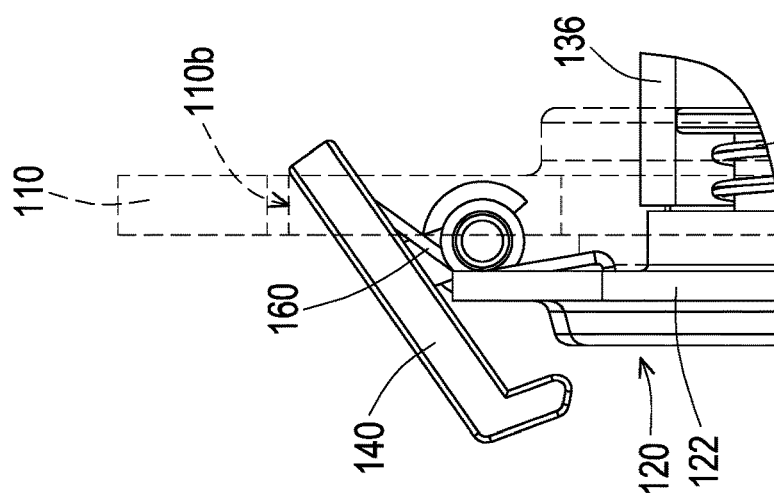
FIG. 1D
FIG. 1C
FIG. 1B

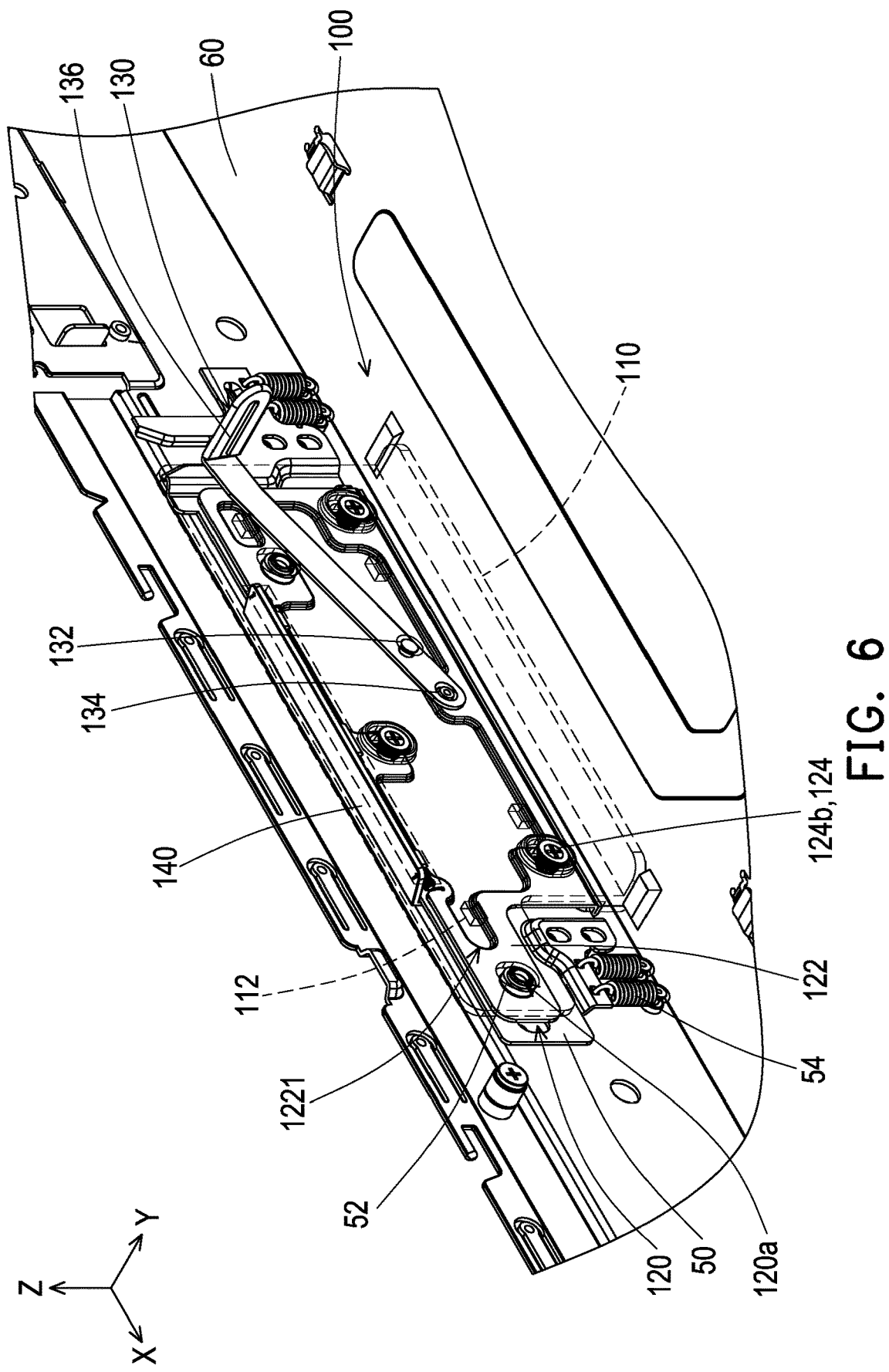

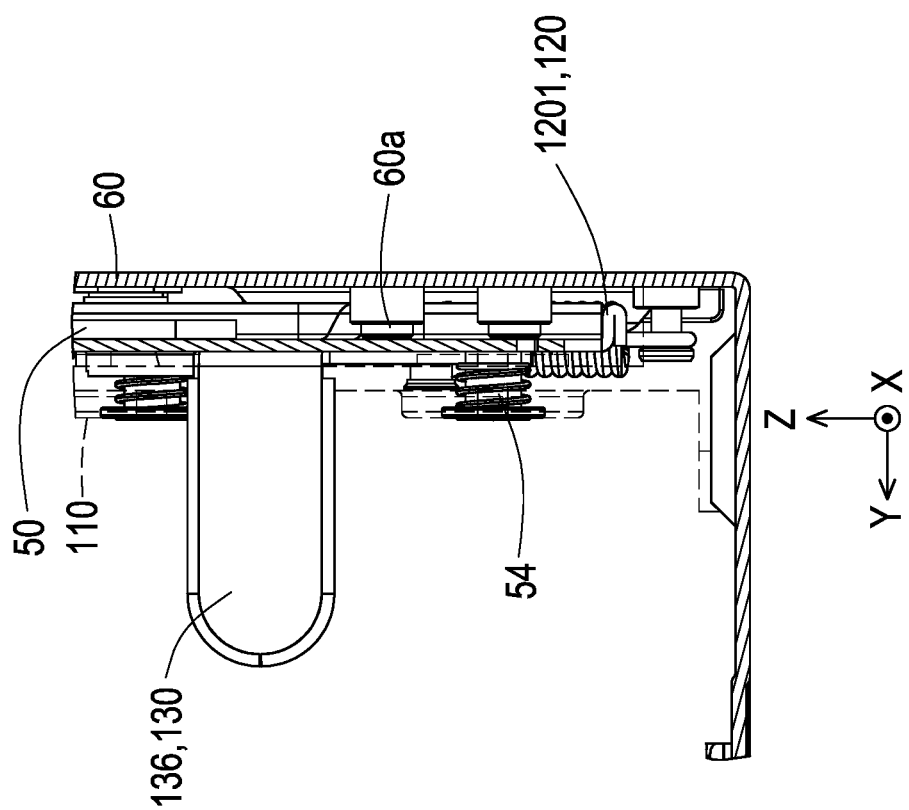
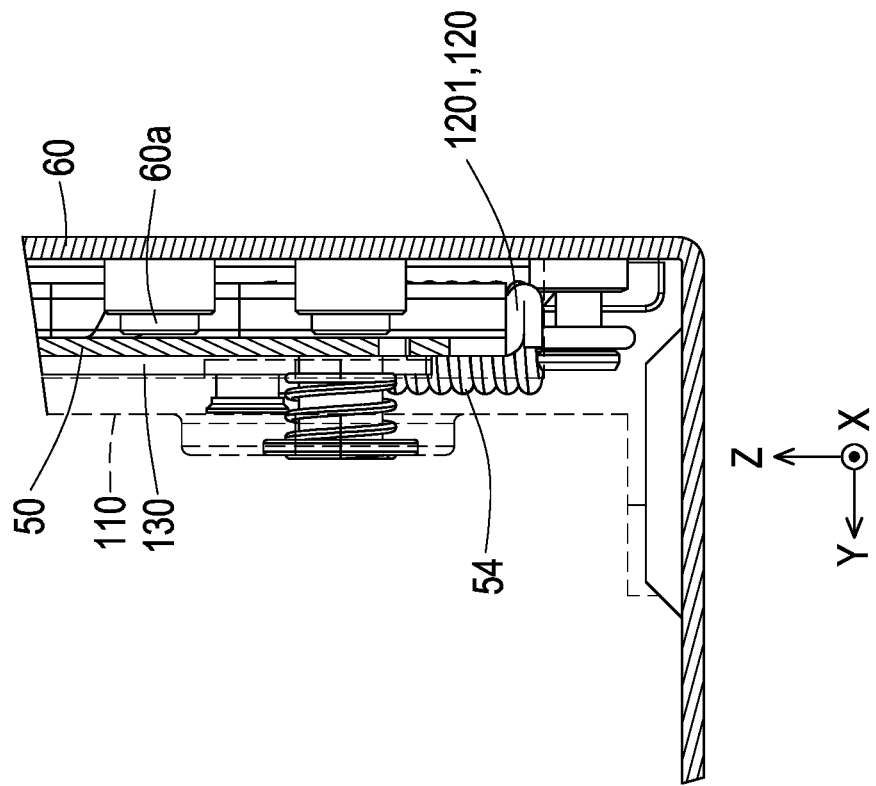

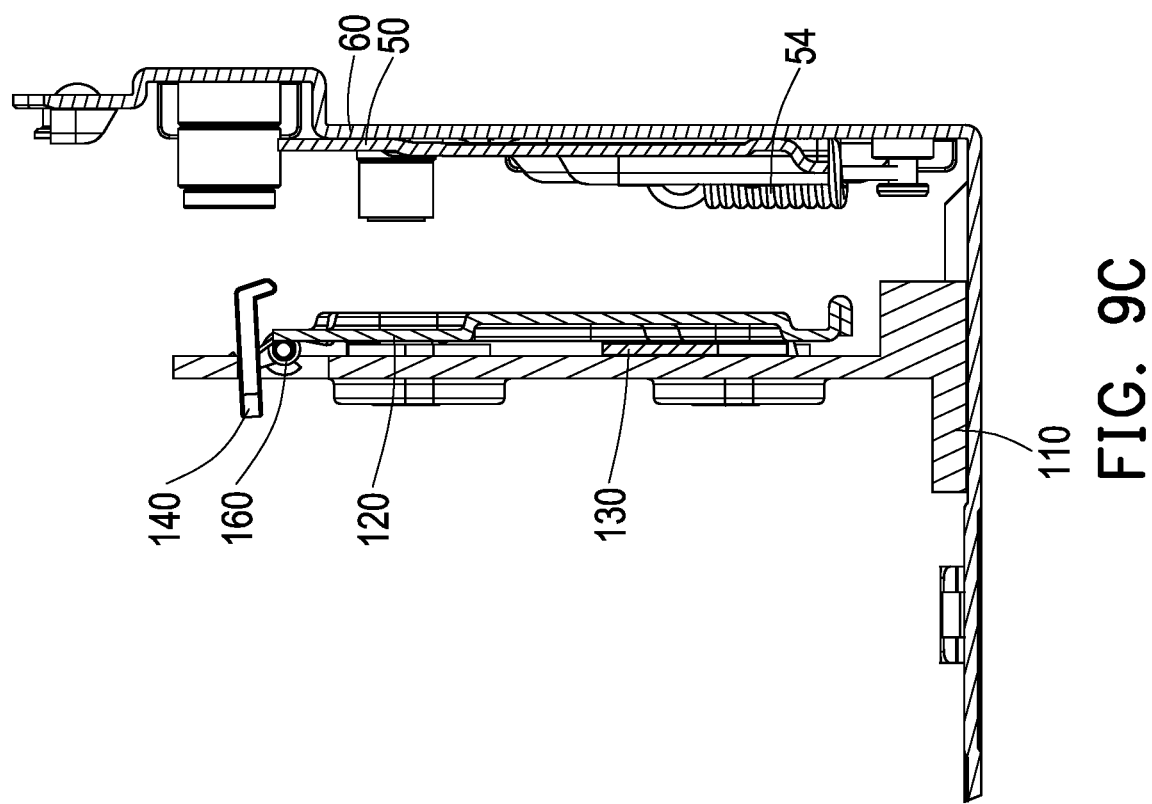

ASSISTANT INSTALLATION DEVICE

CROSS-REFERENCE TO RELATED APPLICATION

This application claims the priority benefit of China application serial no. 202111063278.X, filed on Sep. 10, 2021. The entirety of the above-mentioned patent application is hereby incorporated by reference herein and made a part of this specification.

BACKGROUND

Technical Field

The disclosure relates to an assistant device, and particularly relates to an assistant installation device.

Description of Related Art

The bracket is generally installed in the chassis of a server to configure the internal components of the server. During the process of installing the bracket, the installer needs to hold the bracket with his hand, and lift the bracket against the elastic force of a spring on the bracket after hooking the spring to the chassis, so that the bracket engages with a convex portion in the chassis to position the bracket. Then, screws are used to lock the bracket to locking holes of the convex portion. The above installation steps are complicated, and the force of the spring is about 50 N, which makes the installation very laborious. During the installation process, if a tool is used to pry the bracket up in order to save effort, the bracket will be easily deformed.

SUMMARY

The disclosure provides an assistant installation device, which enables the installation process of an object to be simple and effort saving.

An assistant installation device of the disclosure includes a base, a carrier, and a handle. The base is adapted to be placed on a first object. The carrier is slidably disposed on the base and is adapted to carry a second object. The handle is connected to the base and the carrier. The handle is adapted to drive the carrier to move relative to the base, so that an assembling portion of the second object corresponds to an assembling portion of the first object.

In an embodiment of the disclosure, the carrier is further slidably disposed on the base along a first direction and a second direction perpendicular to the first direction, and the handle is adapted to drive the carrier and the second object on the carrier to move away from the base along the first direction and the second direction, so that the assembling portion of the second object is assembled to the assembling portion of the first object.

In an embodiment of the disclosure, the base has at least one slot, the carrier includes a frame and at least one connecting post, the frame is adapted to carry the second object, and the at least one connecting post is connected to the frame and movably penetrates the at least one slot.

In an embodiment of the disclosure, the assistant installation device includes an elastic member. The elastic member is disposed between the carrier and the base, and the carrier is adapted to reset toward the base by an elastic force of the elastic member.

In an embodiment of the disclosure, the base is provided with at least one convex portion, the carrier is provided with at least one concave portion, and the at least one convex portion is located in the at least one concave portion and is adapted to move along with the carrier relative to the base along the first direction to be moved away from the at least one concave portion and push against the carrier, so that the carrier moves away from the base along the second direction.

In an embodiment of the disclosure, the convex portion is adapted to move along with the carrier relative to the base along the first direction to be moved away from the at least one concave portion after moving a predetermined stroke in the at least one concave portion.

In an embodiment of the disclosure, the handle is provided with a first pivoting portion, a second pivoting portion, and an operating portion, the first pivoting portion is located between the second pivoting portion and the operating portion and is pivotally connected to the base, and the second pivoting portion is pivotally connected to the carrier.

In an embodiment of the disclosure, a pivot axis of the first pivoting portion and a pivot axis of the second pivoting portion are parallel to each other.

In an embodiment of the disclosure, there is a gap between the base and the carrier, the handle is located in the gap, and the operating portion protrudes out of the gap.

In an embodiment of the disclosure, the assistant installation device includes a limiting member. The limiting member is pivotally connected to the carrier and is adapted to rotate relative to the carrier to limit the second object or release the second object.

In an embodiment of the disclosure, the assistant installation device includes an elastic member. The elastic member is disposed between the limiting member and the carrier, the limiting member is adapted to rotate to a first state by an elastic force of the elastic member to limit the second object, and the limiting member is adapted to resist the elastic force of the elastic member and rotate to a second state to release the second object.

In an embodiment of the disclosure, the base is provided with an opening, and the limiting member extends into the opening and is adapted to be pushed by an inner edge of the opening to rotate from the first state to the second state.

Based on the above, in the assistant installation device of the disclosure, the carrier may carry the second object to be installed, and the installer may use the handle to save effort in driving the carrier to move along the first direction, so that the assembling portion of the second object corresponds to the assembling portion of the first object. In this way, the installation process of the second object can be simple and effort saving.

BRIEF DESCRIPTION OF THE DRAWINGS

FIG. 1B is a partial rear view of the assistant installation device of FIG. 1A.

FIG. 1C is a partial cross-sectional view of the assistant installation device of FIG. 1A.

FIG. 1D is a partial cross-sectional view of the assistant installation device of FIG. 1A.

FIG. 6 shows the assistant installation device and the second object of FIG. 5B being placed on a first object.

FIG. 8A to FIG. 8C are respectively partial front views of the structures of FIG. 7A to FIG. 7C.

FIG. 9A to FIG. 9C show a manner of separating the assistant installation device from the second object.

DETAILED DESCRIPTION OF DISCLOSED EMBODIMENTS

Figure 1A:
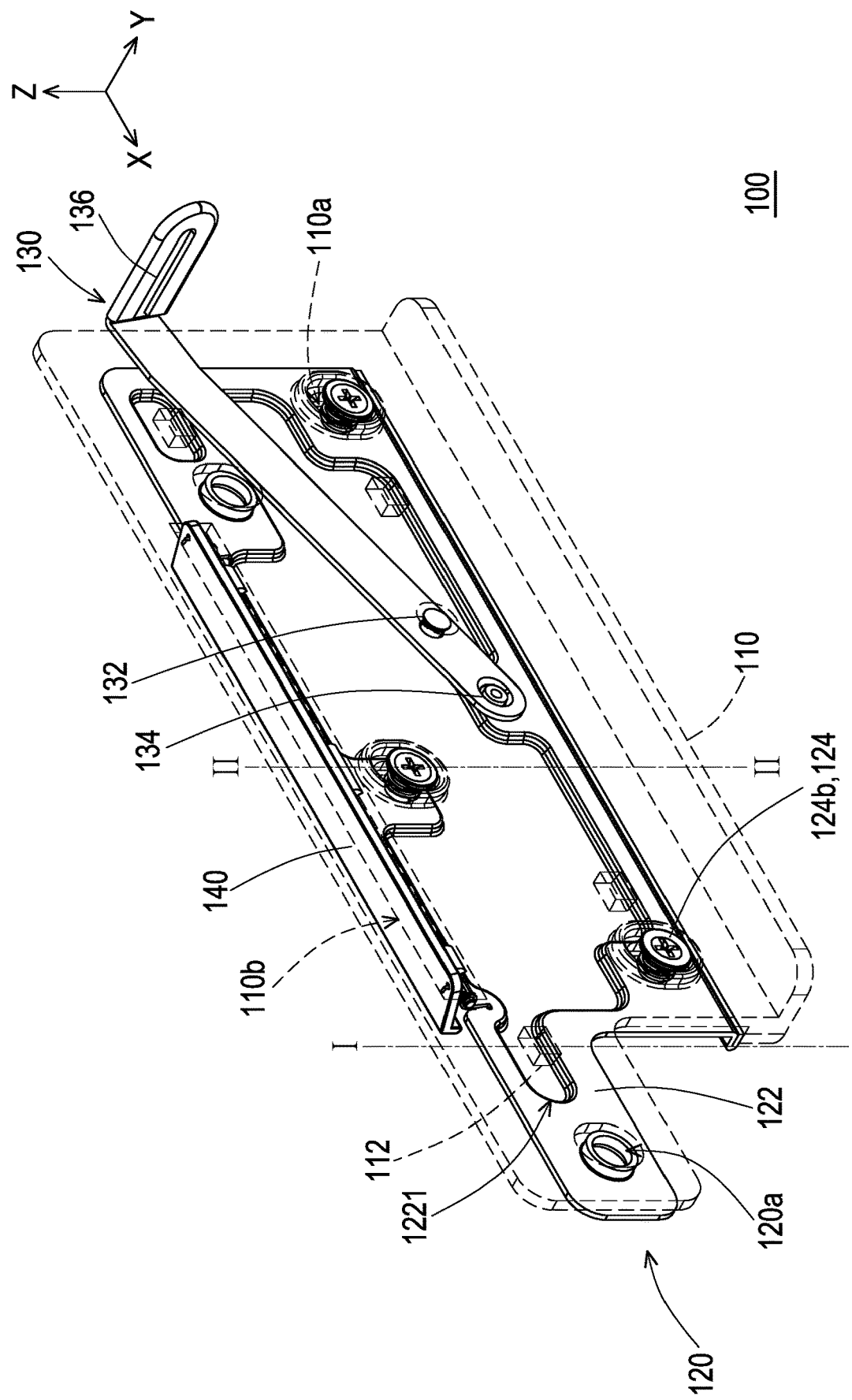
FIG. 1A is a perspective view of an assistant installation device according to an embodiment of the disclosure.
Figure 2:
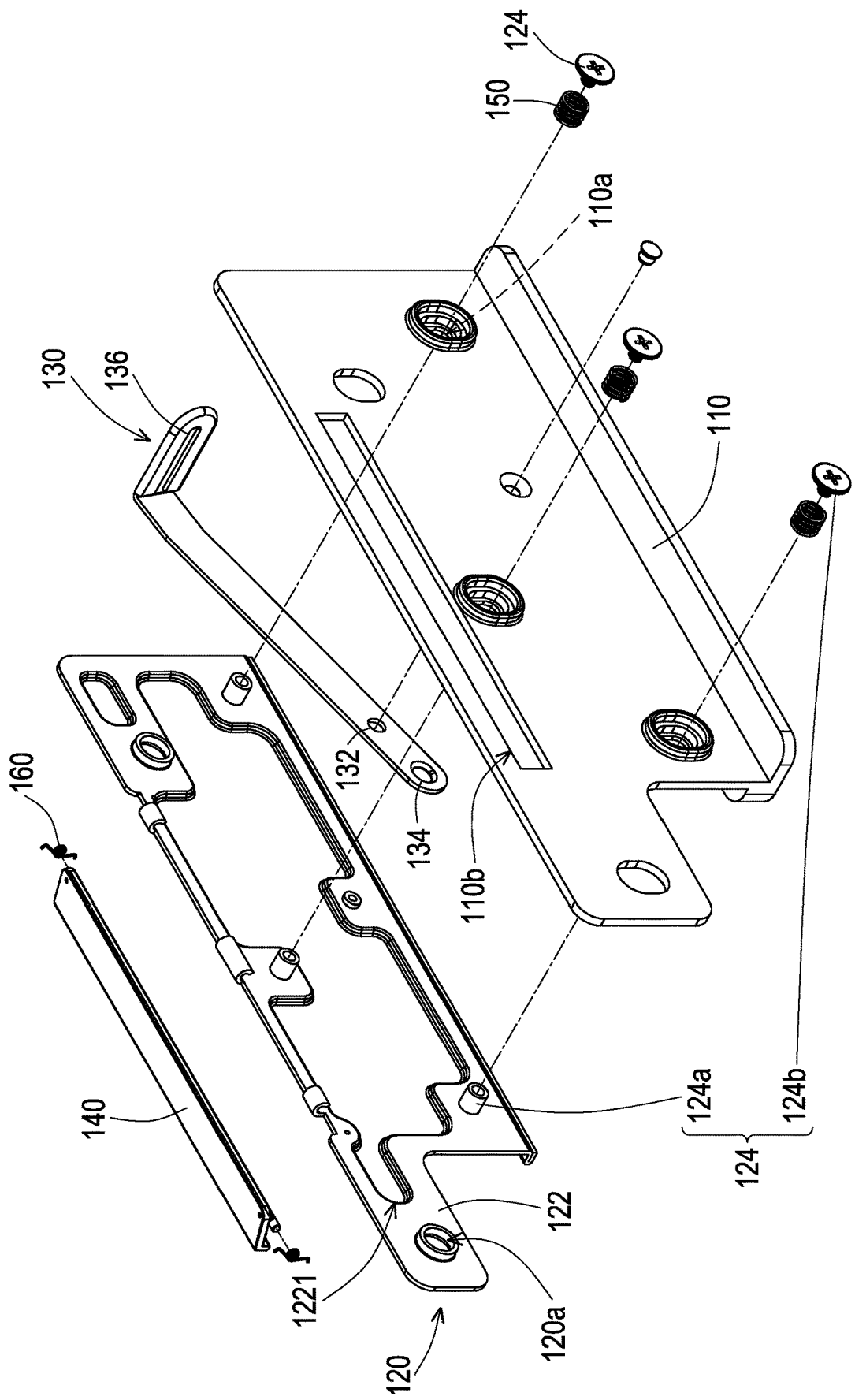
FIG. 2 is an exploded view of the assistant installation device of FIG. 1A.

FIG. 1A is a perspective view of an assistant installation device according to an embodiment of the disclosure. FIG. 1B is a partial rear view of the assistant installation device of FIG. 1A, in which an assistant installation device 100 is viewed along a direction opposite to an axial direction X. FIG. 1C is a partial cross-sectional view of the assistant installation device of FIG. 1A, which corresponds to a line I-I of FIG. 1A. FIG. 1D is a partial cross-sectional view of the assistant installation device of FIG. 1A, which corresponds to a line II-II of FIG. 1A. FIG. 2 is an exploded view of the assistant installation device of FIG. 1A. Please refer to FIG. 1A to FIG. 2. The assistant installation device 100 of the embodiment includes a base 110, a carrier 120, a handle 130, a limiting member 140, multiple elastic members 150, and multiple elastic members 160. The carrier 120 is slidably disposed on the base 110. In detail, the carrier 120 is slidably disposed on the base 110 along a first direction (an axial direction Z), and the carrier 120 is further slidably disposed on the base 110 along a second direction (an opposite direction of an axial direction Y) perpendicular to the first direction Z. In other words, the carrier 120 may move relative to the base 110 in the first direction Z and the second direction Y. The handle 130 is connected to the base 110 and the carrier 120 and is located in a gap G (labelled in FIG. 1C) between the base 110 and the carrier 120. The elastic member 150 is, for example, a compression spring and is disposed between the carrier 120 and the base 110. The limiting member 140 is pivotally connected to the carrier 120. The elastic member 160 is, for example, a torsion spring and is disposed between the limiting member 140 and the carrier 120.

Figure 3A:
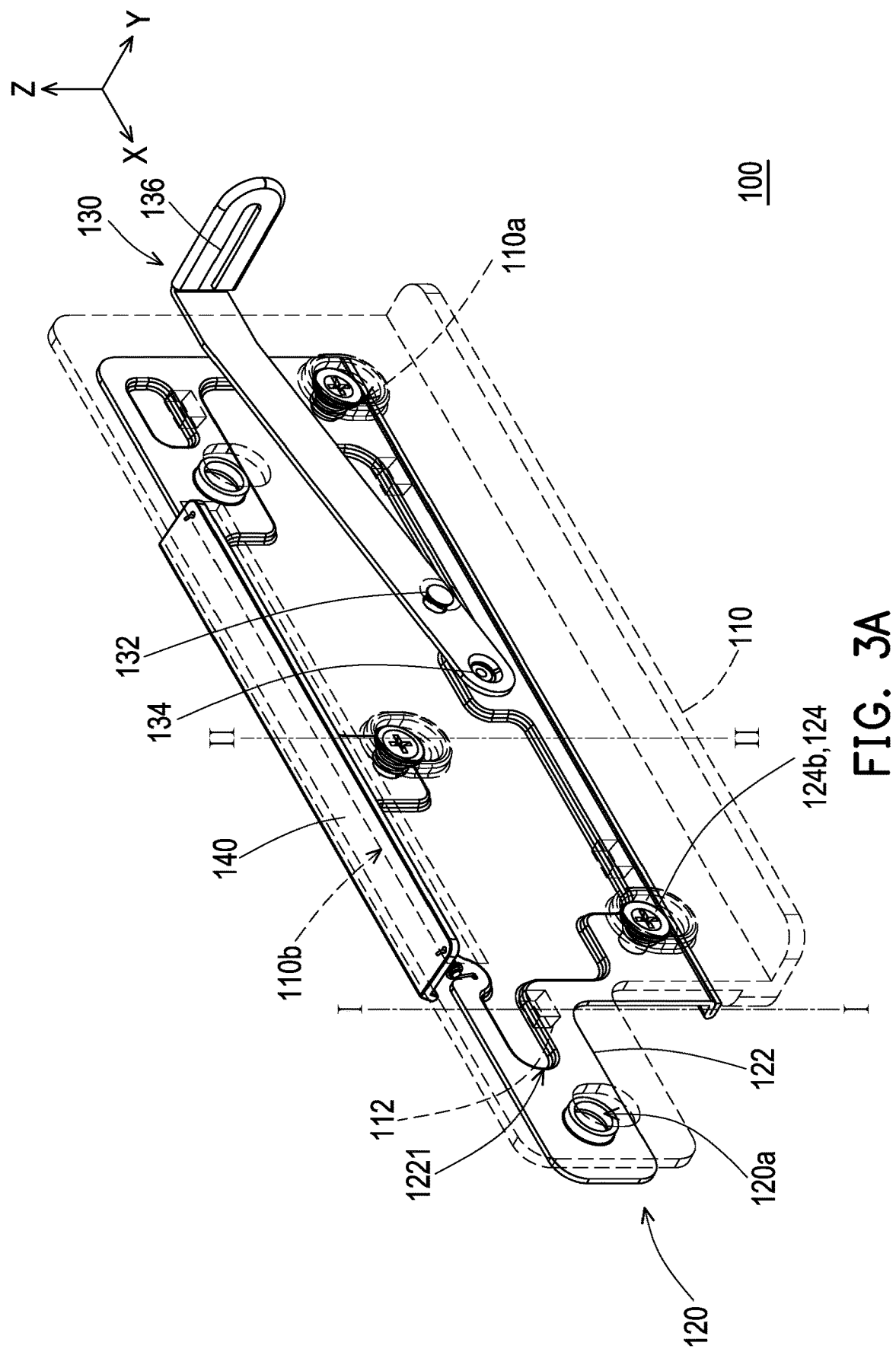
FIG. 3A shows an actuation of the assistant installation device of FIG. 1A.
Figure 3B:
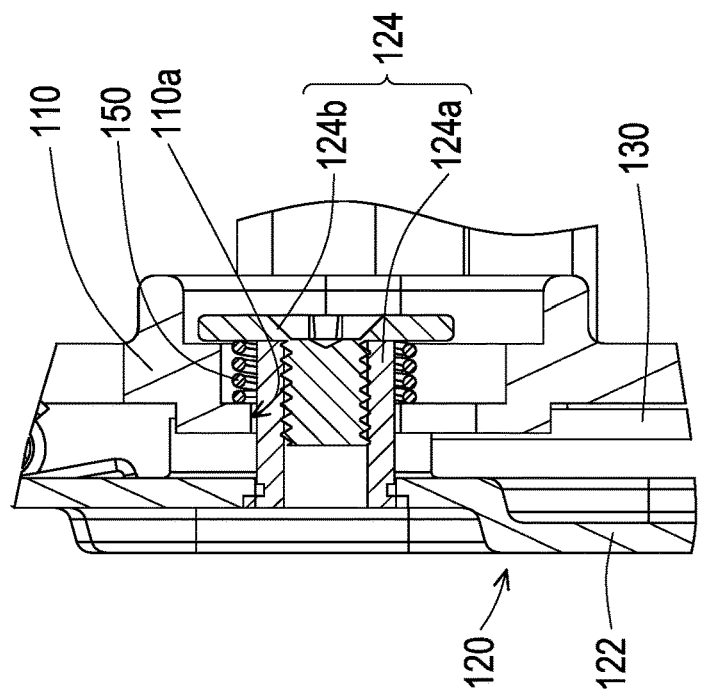
FIG. 3B is a partial rear view of the assistant installation device of FIG. 3A.
Figure 3C:
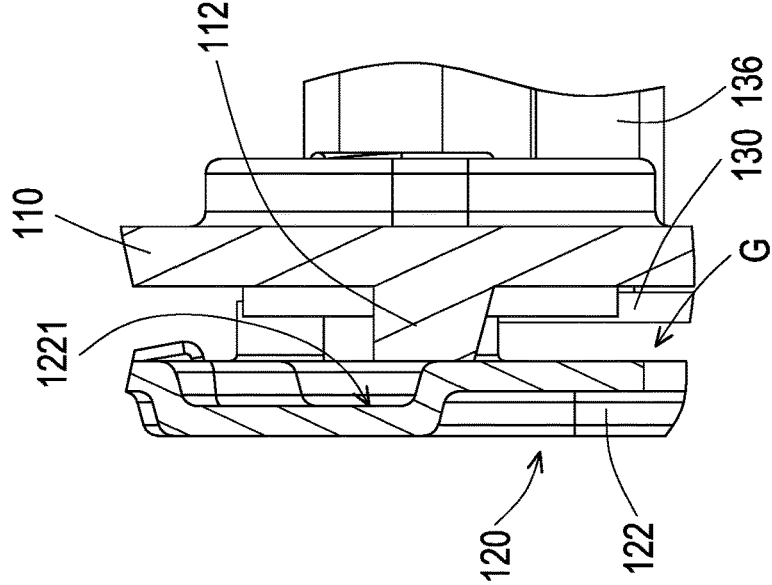
FIG. 3C is a partial cross-sectional view of the assistant installation device of FIG. 3A.
Figure 3D:
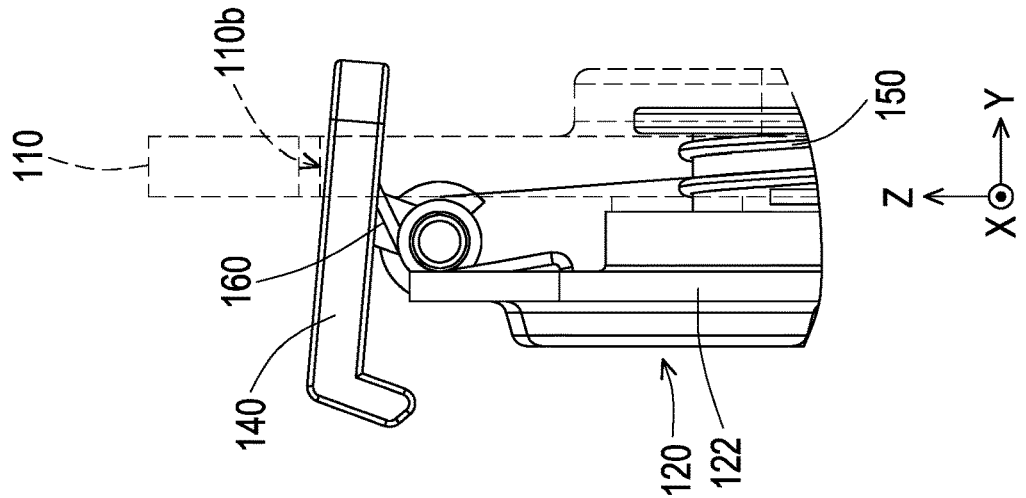
FIG. 3D is a partial cross-sectional view of the assistant installation device of FIG. 3A.

FIG. 3A shows an actuation of the assistant installation device of FIG. 1A. FIG. 3B is a partial rear view of the assistant installation device of FIG. 3A, in which the assistant installation device 100 is viewed along the direction opposite to the axial direction X. FIG. 3C is a partial cross-sectional view of the assistant installation device of FIG. 3A, which corresponds to a line I-I of FIG. 3A. FIG. 3D is a partial cross-sectional view of the assistant installation device of FIG. 3A, which corresponds to a line II-II of FIG. 3A. The handle 130 is adapted to drive the carrier 120 to move relative to the base 110 along the first direction (the axial direction Z) as shown in FIG. 1A to FIG. 3A while driving the carrier 120 to move away from the base 110 along the second direction (the axial direction Y) as shown in FIG. 1C, FIG. 1D to FIG. 3C, and FIG. 3D. Moreover, the handle 130 is adapted to drive the carrier 120 to move relative to the base 110 along a direction (an opposite direction of the axial direction Z) opposite to the first direction as shown in FIG. 3A to FIG. 1A while driving the carrier 120 to reset toward the base 110 along the direction (the opposite direction of the axial direction Y) opposite to the second direction as shown in FIG. 3C, FIG. 3D to FIG. 1C, and FIG. 1D. On the other hand, the limiting member 140 is adapted to rotate relative to the carrier 120 to a first state shown in FIG. 1B by the elastic force of the elastic member 160. As the carrier 120 moves relative to the base 110 along the first direction (the axial direction Z), the base 110 resists the elastic force of the elastic member 160 and pushes the limiting member 140, so that the limiting member 140 resists the elastic force of the elastic member 160 and rotates relative to the carrier 120 to a second state shown in FIG. 3B.

The specific configuration manner of the handle 130 of the embodiment will be described in detail below.

Please refer to FIG. 1A and FIG. 3A. The handle 130 of the embodiment is provided with a first pivoting portion 132, a second pivoting portion 134, and an operating portion 136. The first pivoting portion 132 is located between the second pivoting portion 134 and the operating portion 136 and is pivotally connected to the base 110. The second pivoting portion 134 is pivotally connected to the carrier 120. A pivot axis (the axial direction Y) of the first pivoting portion 132 and a pivot axis (the axial direction Y) of the second pivoting portion 134 are parallel to each other and are perpendicular to the first direction (the axial direction Z). The operating portion 136 protrudes out of the gap G (labelled in FIG. 1C) to facilitate operation by the installer. When the operating portion 136 of the handle 130 is pressed down as shown in FIG. 1A to FIG. 3A, the handle 136 drives the carrier 120 to move relative to the base 110 along the first direction (the axial direction Z). Conversely, when the operating portion 136 of the handle 130 is lifted up as shown in FIG. 3A to FIG. 1A, the handle 136 drives the carrier 120 to move relative to the base 110 along the direction (the opposite direction of the axial direction Z) opposite to the first direction. In addition, the base 110 and/or the carrier 120 may be provided with a stop structure corresponding to the handle 130 to limit the actuating angle of the handle 130 to between an angle shown in FIG. 1A and an angle shown in FIG. 3A.

The specific relative configuration relationship between the base 110 and the carrier 120 of the embodiment will be described in detail below.

Please refer to FIG. 1A to FIG. 3D. The carrier 120 of the embodiment includes a frame 122 and multiple connecting posts 124 (one is shown as a representative). The base 110 has multiple slots 110a (one is shown as a representative). The connecting post 124 is connected to the frame 122 and movably penetrates the slot 110a along the first direction (the axial direction Z) and the second direction (the axial direction Y). The connecting post 124 includes a stud 124a and a screw 124b. The stud 124 is connected to the frame 122. The screw 124b is screw-locked to the connecting post 124. The elastic member 150 is sleeved onto the stud 124*a* and is compressibly disposed between the frame 122 and a head portion of the screw 124*b*.

On the other hand, the base 110 is provided with at least one convex portion 112 as shown in FIG. 1C and FIG. 3C. The frame 122 of the carrier 120 is provided with at least one concave portion 1221. The convex portion 112 is located in the concave portion 1221 as shown in FIG. 1C. When the carrier 120 of FIG. 1A is driven by the handle 130 to move relative to the base 110 to a position shown in FIG. 3A along the first direction (the axial direction Z), the convex portion 112 is then moved away from the concave portion 1221 and pushes against the frame 122 of the carrier 120 as shown in FIG. 3C, so that the carrier 120 moves away from the base 110 along the second direction (the opposite direction of the axial direction Y). When the carrier 120 is driven by the handle 130 in the opposite direction to reset to a position shown in FIG. 1A relative to the base 110 along the direction (the opposite direction of the axial direction Z) opposite to the first direction, the convex portion 112 returns to a position corresponding to the concave portion 1221, and the carrier 120 is reset toward the base 110 to a position shown in FIG. 1C and FIG. 1D by the elastic force of the elastic member 150.

In some embodiments, the size of the concave portion 1221 may be greater than the size of the convex portion 112, so that the convex portion 112 moves along with the carrier 120 relative to the base 110 along the first direction (the axial direction Z) and is moved away from the concave portion 1221 after moving a predetermined stroke in the concave portion 1221. Therefore, the actuating manner of the carrier 120 may be controlled to be pushed away from the base 110 by the convex portion 112 along the second direction (the opposite direction of the axial direction Y) after being raised by a predetermined distance (corresponding to the predetermined stroke) relative to the base 110 along the first direction (the axial direction Z).

The specific relative configuration relationship between the base 110 and the limiting member 140 of the embodiment will be described in detail below.

The base 110 of the embodiment has an opening 110*b*. The limiting member 140 extends into the opening 110*b*. During the process of raising the carrier 120 relative to the base 110 along the first direction (the axial direction Z) as shown in FIG. 1B to FIG. 3B, the limiting member 140 abuts against an inner edge of the opening 110*b* of the base 110 and rotates from the first state shown in FIG. 1B to the second state shown in FIG. 3B.

The following describes how to use the assistant installation device 100 of the embodiment to install an object.

Figure 4A:
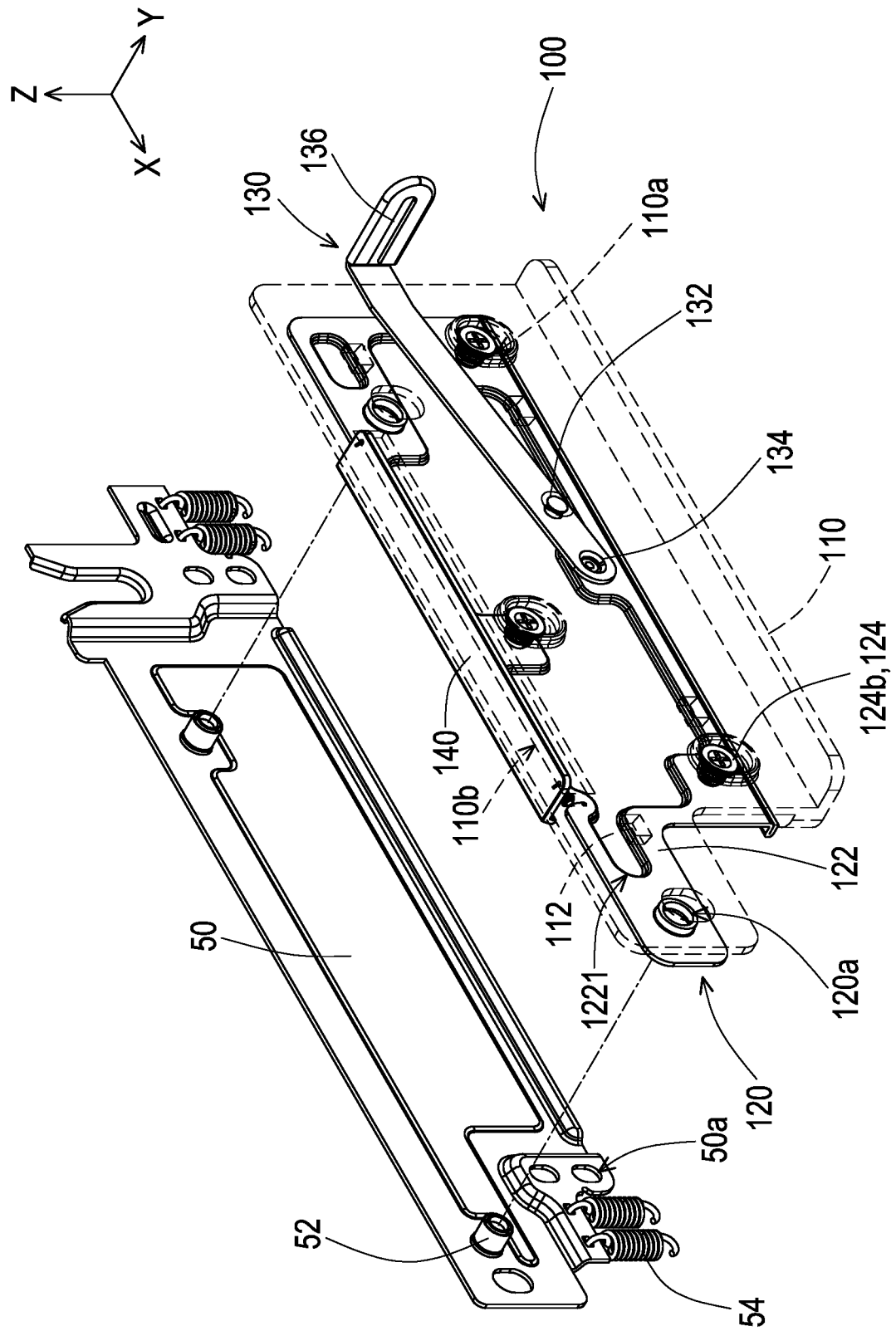
FIG. 4A and FIG. 4B show a manner of combining a second object with the assistant installation device.
Figure 4B:
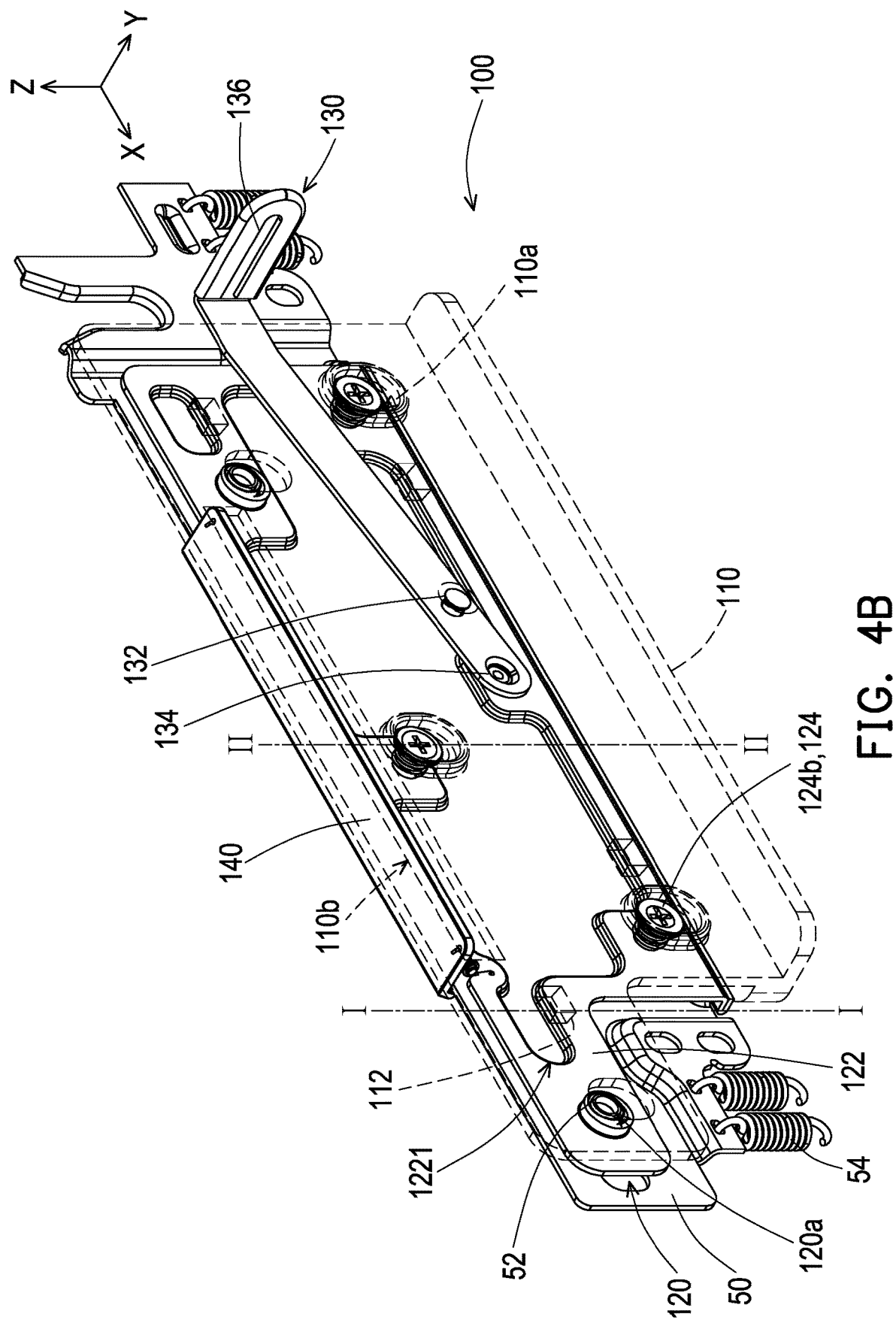

FIG. 4A and FIG. 4B show a manner of combining a second object with the assistant installation device. The installer may first press down the operating portion 136 of the handle 130 as shown in FIG. 4A to raise the carrier 120 relative to the base 110, so that the limiting member 140 is correspondingly in the second state shown in FIG. 3B. Then, the installer may extend a positioning pillar 52 of a second object 50 (such as a bracket) into a positioning hole 120*a* of the frame 122 of the carrier 120 of the assistant installation device 100 as shown in FIG. 4A to FIG. 4B, so that the second object 50 is positioned on the frame 122.

Figure 5B:
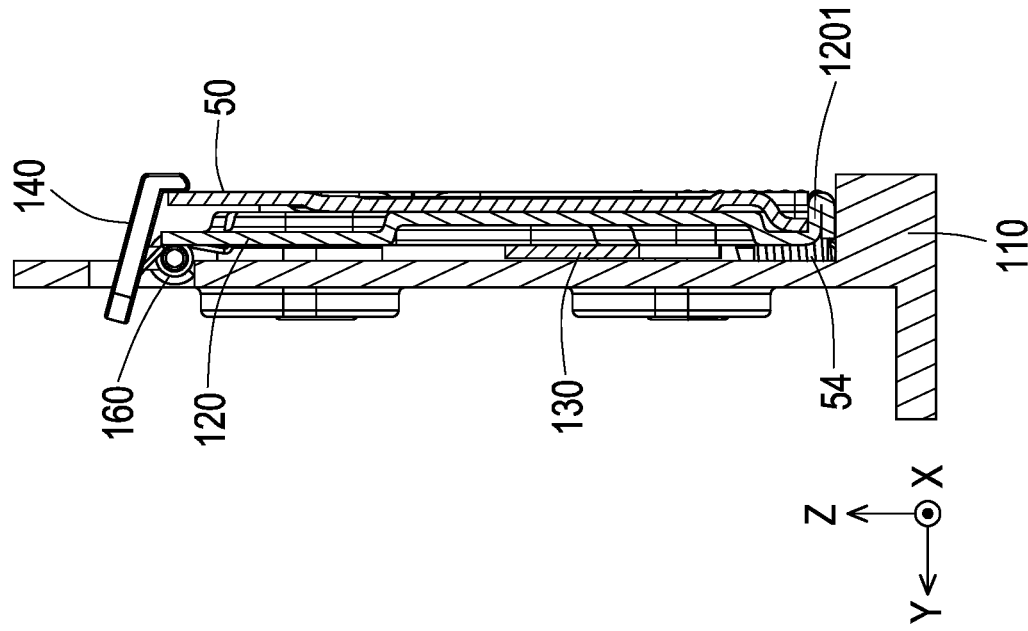
FIG. 5A and FIG. 5B show a manner of limiting the second object to the assistant installation device.
Figure 5A:
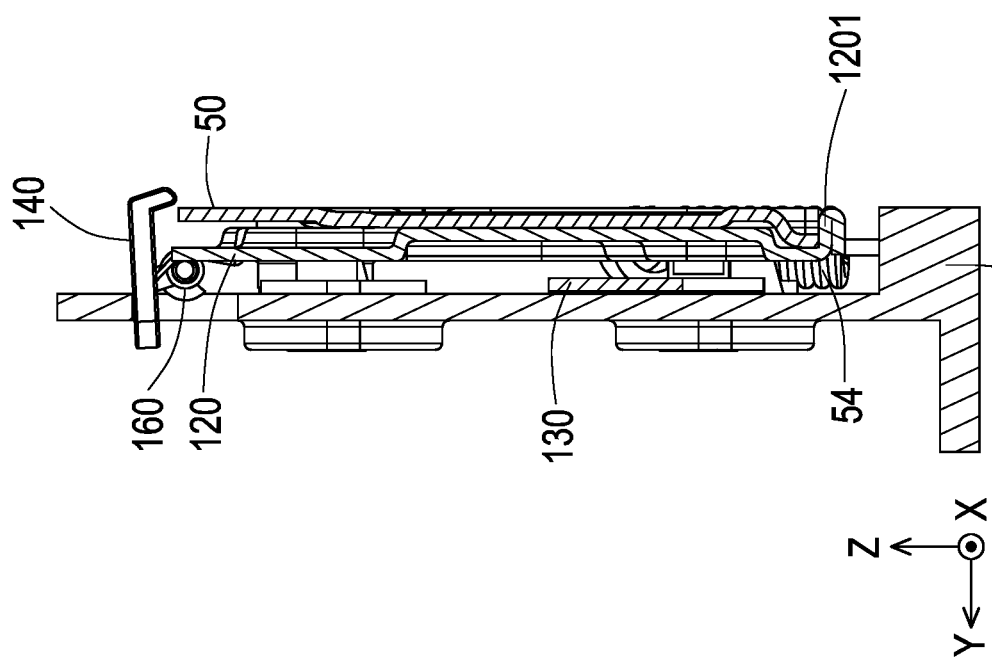

FIG. 5A and FIG. 5B show a manner of limiting the second object to the assistant installation device. After combining the second object 50 with the assistant installation device 100 as shown in FIG. 4B, the installer may lift up the operating portion 136 (shown in FIG. 1A) of the handle 130 as shown in FIG. 5A to FIG. 5B, so that the carrier 120 is lowered relative to the base 110, and the limiting member 140 rotates relative to the carrier 120 to a first state shown in FIG. 5B by the elastic force of the elastic member 160 to limit the second object 50 onto the carrier 120. As shown in FIG. 5A and FIG. 5B, the carrier 120 may carry the second object 50 by a folded wall 1201 at a bottom portion thereof to cooperate with the limit of the limiting member 140 on a top portion thereof on the second object 50 and firmly fix the second object 50 onto the carrier 120. The folded wall 1201 is formed by extending the bottom portion of the carrier 120 opposite to the base 110 (opposite to the second direction and the axial direction Y).

FIG. 6 shows the assistant installation device and the second object of FIG. 5B being placed on a first object. After fixing the second object 50 onto the carrier 120 of the assistant installation device 100 as shown in FIG. 5B, the installer may place the base 110 of the assistant installation device 100 on a first object 60 (for example, a chassis of a server) as shown in FIG. 6.

Figure 7A:
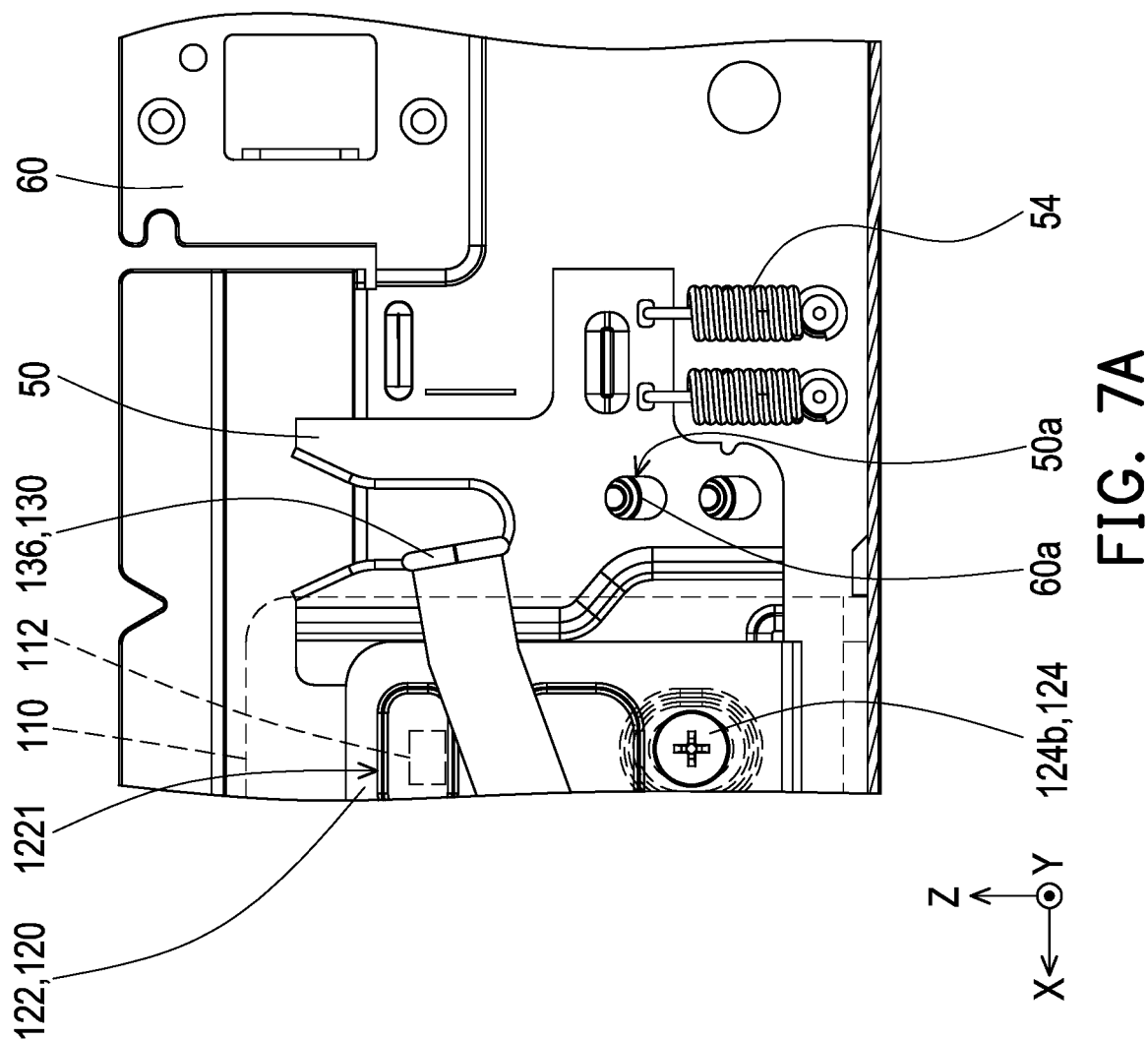
FIG. 7A to FIG. 7C show a manner of assembling the second object to the first object by using the assistant installation device of FIG. 6.
Figure 7B:
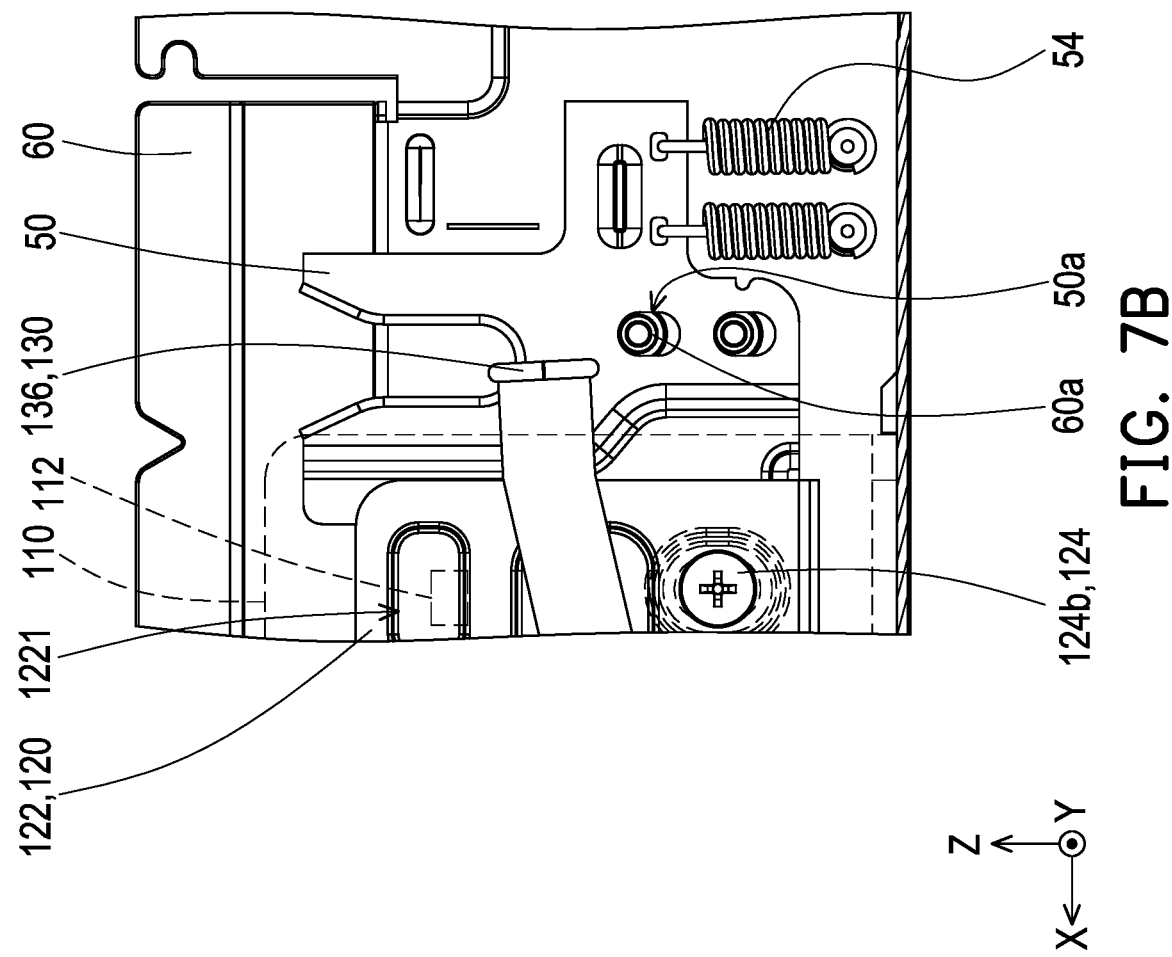
Figure 7C:
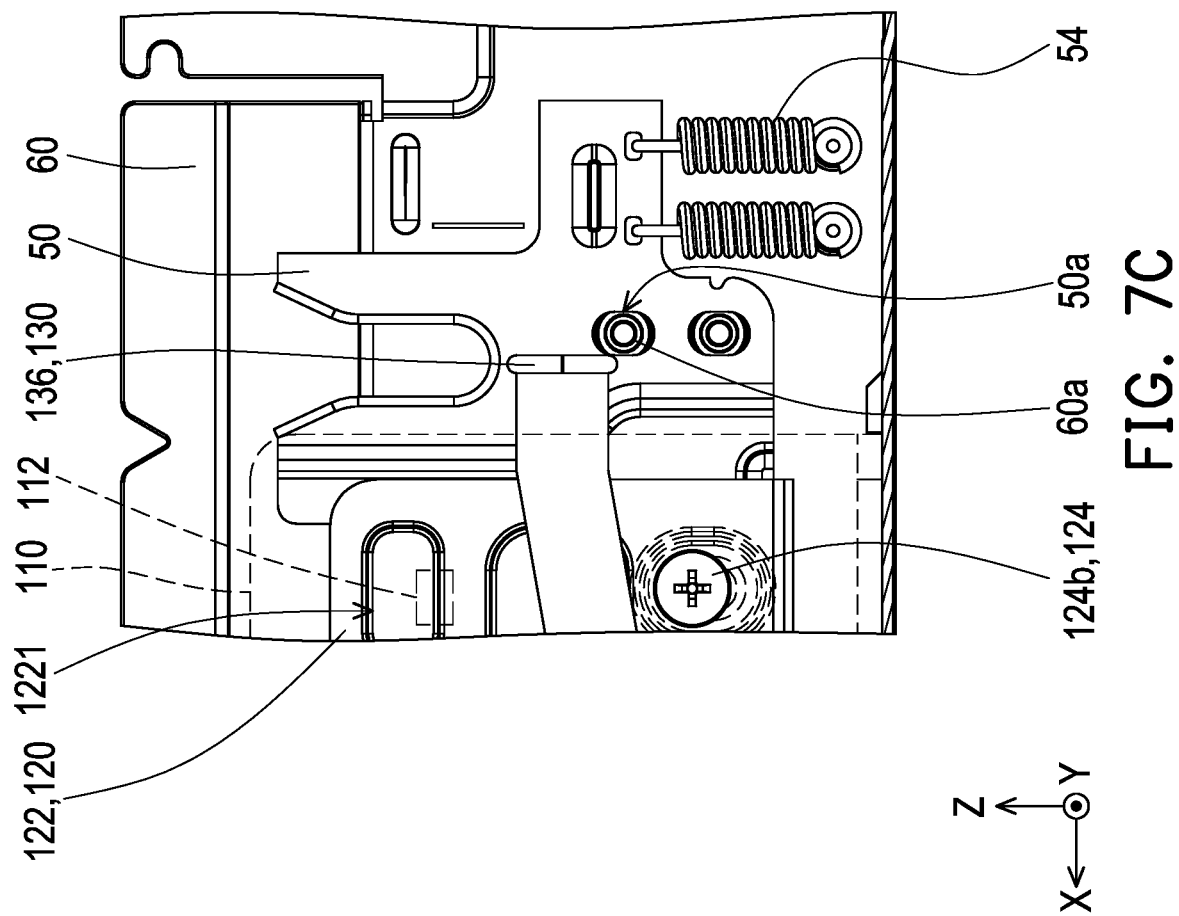
Figure 8C:
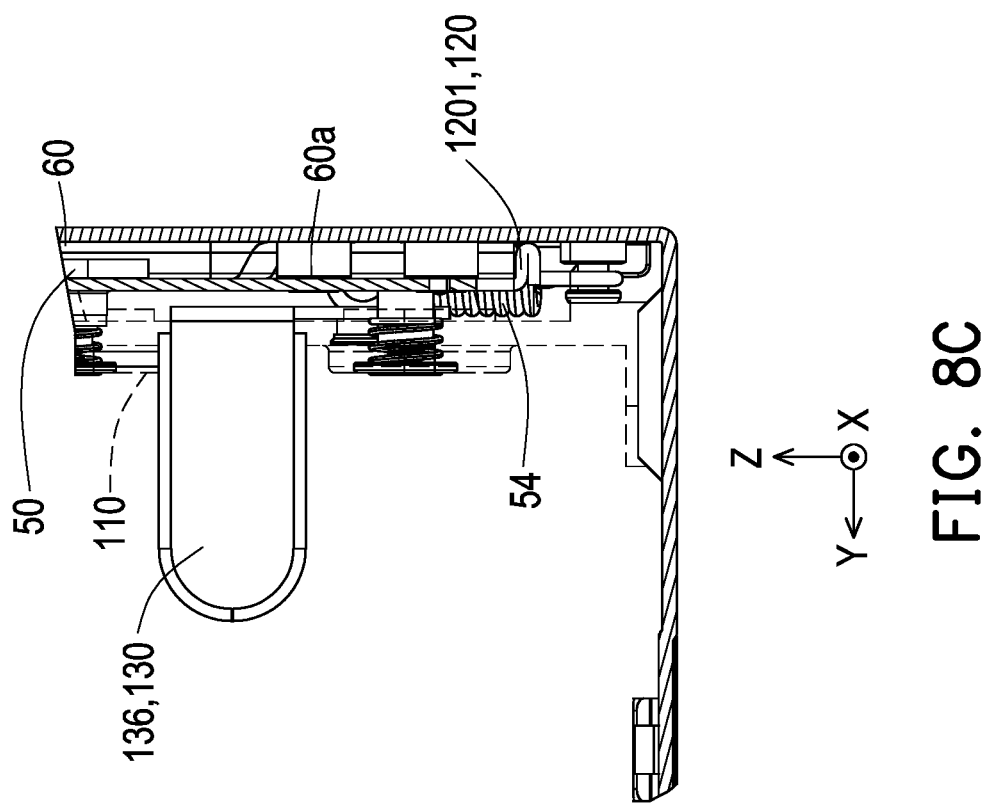

FIG. 7A to FIG. 7C show a manner of assembling the second object to the first object by using the assistant installation device of FIG. 6. FIG. 8A to FIG. 8C are respectively partial front views of the structures of FIG. 7A to FIG. 7C. After placing the base 110 of the assistant installation device 100 on the first object 60 as shown in FIG. 6, the installer may first connect an assembling member 54 (such as a spring) of the second object 50 to the first object 60 as shown in FIG. 7A. Then, the installer may press down the operating portion 136 of the handle 130 as shown in FIG. 7A to FIG. 7B to drive the carrier 120 and the second object 50 thereon to be raised relative to the base 110 and the first object 60 along the first direction (the axial direction Z) as shown in FIG. 8A to FIG. 8B, so that an assembling portion 50*a* (shown as a slot) of the second object 50 corresponds to an assembling portion 60*a* (shown as a stud) of the first object 60. Then, the installer may continue to press down the operating portion 136 of the handle 130 as shown in FIG. 7B to FIG. 7C to drive the carrier 120 and the second object 50 thereon to move away from the base 110 along the second direction (the opposite direction of the axial direction Y) as shown in FIG. 8B to FIG. 8C, so that the stud (the assembly portion 60*a*) of the first object 60 may extend into the slot (the assembly portion 50*a*) of the second object 50.

Figure 9B:
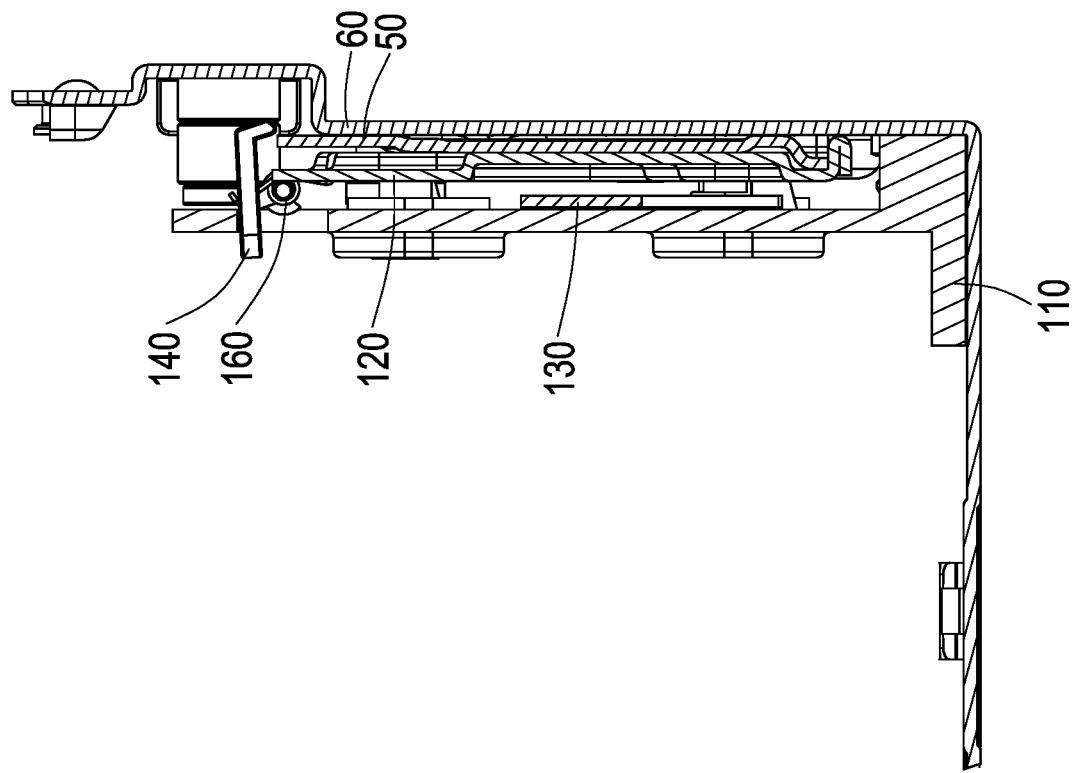
Figure 9A:
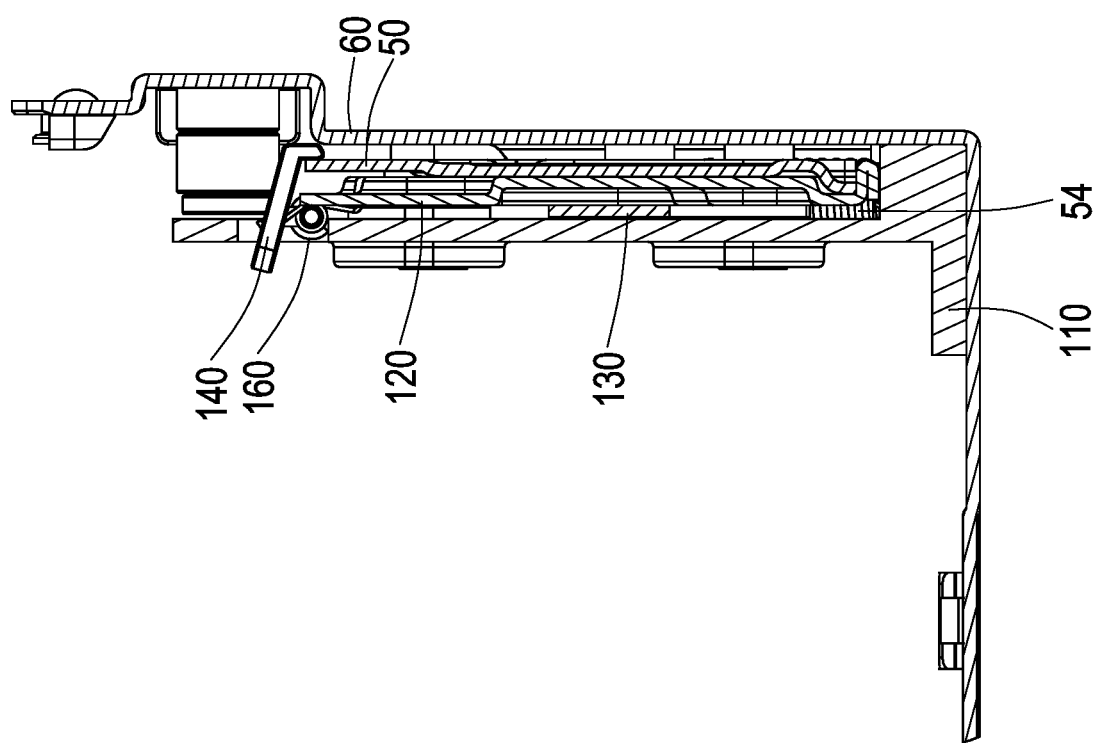
Figure 10:
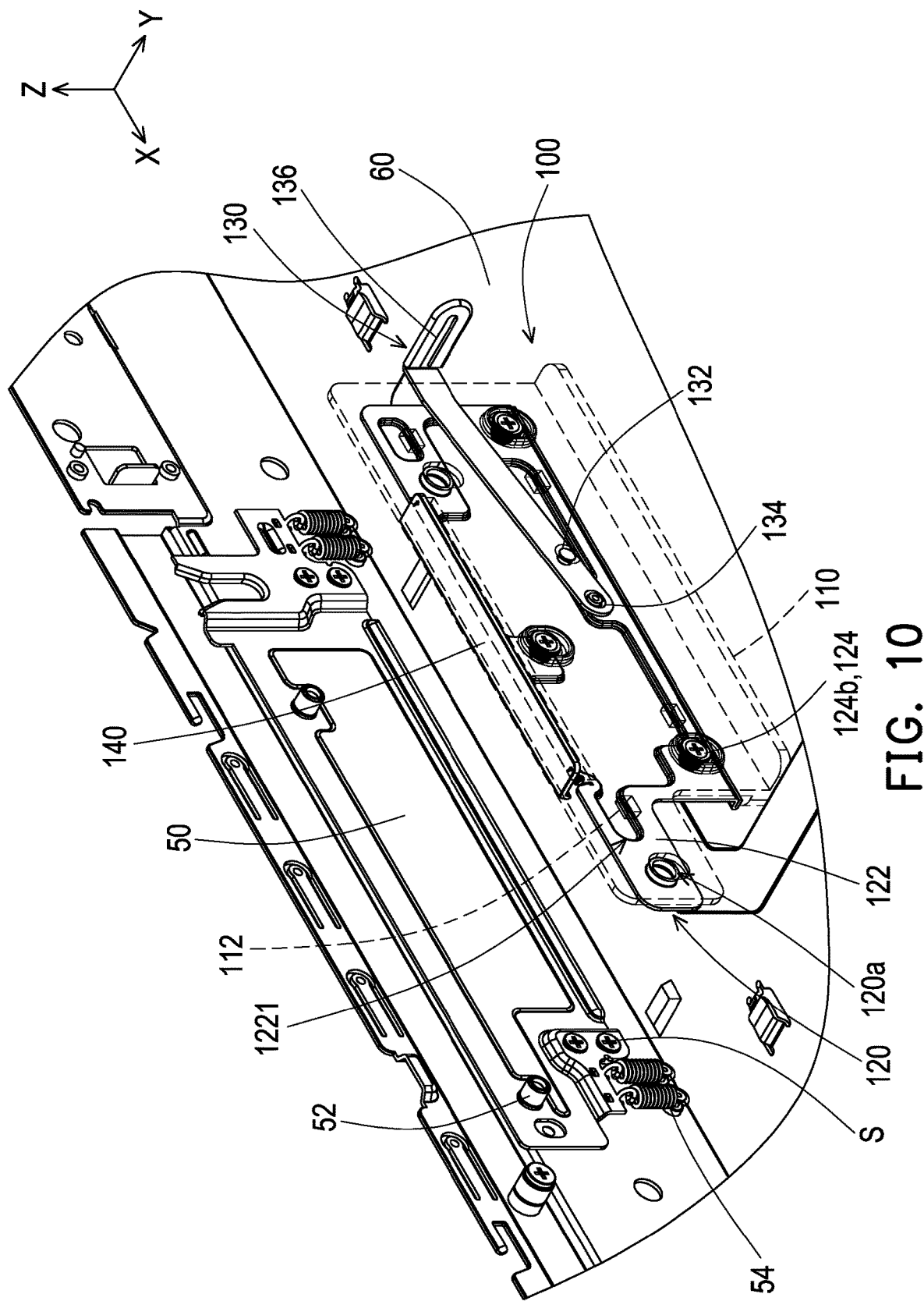
FIG. 10 shows the assistant installation device of FIG. 6 separated from the second object assembled to the first object.

FIG. 9A to FIG. 9C show a manner of separating the assistant installation device from the second object. FIG. 10 shows the assistant installation device of FIG. 6 separated from the second object assembled to the first object. During the assembly process of FIG. 7A to FIG. 7C, due to the uplifting of the carrier 120 relative to the base 110, the limiting member 140 will be rotated from the first state where the second object 50 is limited onto the carrier 120 to the second state of resisting the elastic force of the elastic member 160 to release the second object 50. Therefore, the installer may separate the assistant installation device 100 from the second object 50 assembled to the first object 60 as shown in FIG. 9C and FIG. 10. Finally, the installer may use a screw S to pass through the slot (the assembling portion 50*a*) of the second object 50 to screw-lock the second object 50 to the stud (the assembling portion 60*a*) of the first object 60 to complete the assembly of the second object 50 and the first object 60.

With the above installation process of the assistant installation device 100 of the embodiment, the installation process of the second object 50 can be simple and effort saving. In other embodiments, the carrier 120 may be designed to be raised and lowered relative to the base 110 only along the first direction (the axial direction Z) and not move relative to the base 110 along the second direction (the axial direction Y) to be suitable for the assembly of other types of components, which is not limited by the disclosure and is illustrated with drawings as follows.

Figure 11:
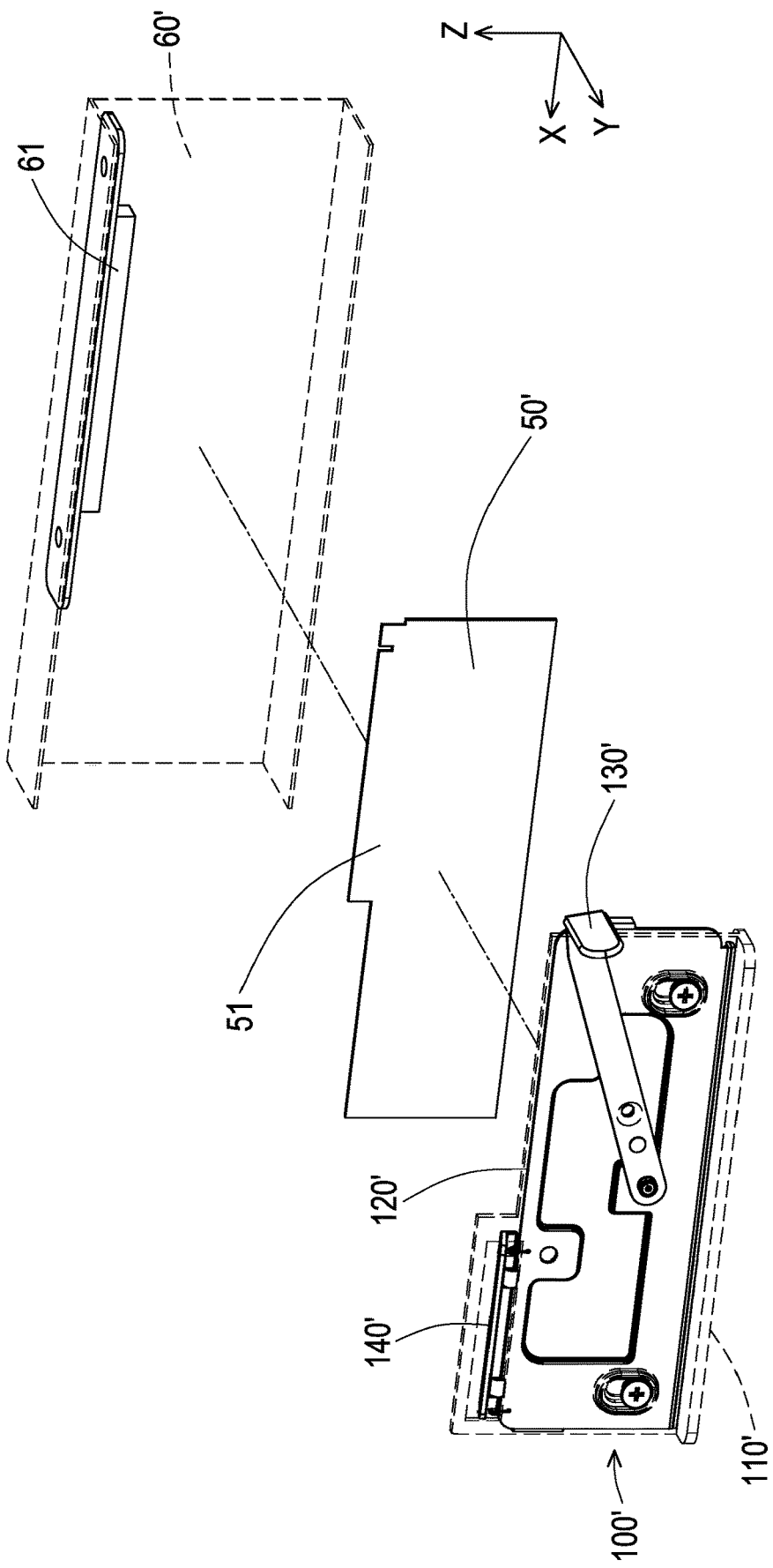
FIG. 11 is an exploded view of an assistant installation device, a second object, and a first object according to another embodiment of the disclosure.
Figure 12A:
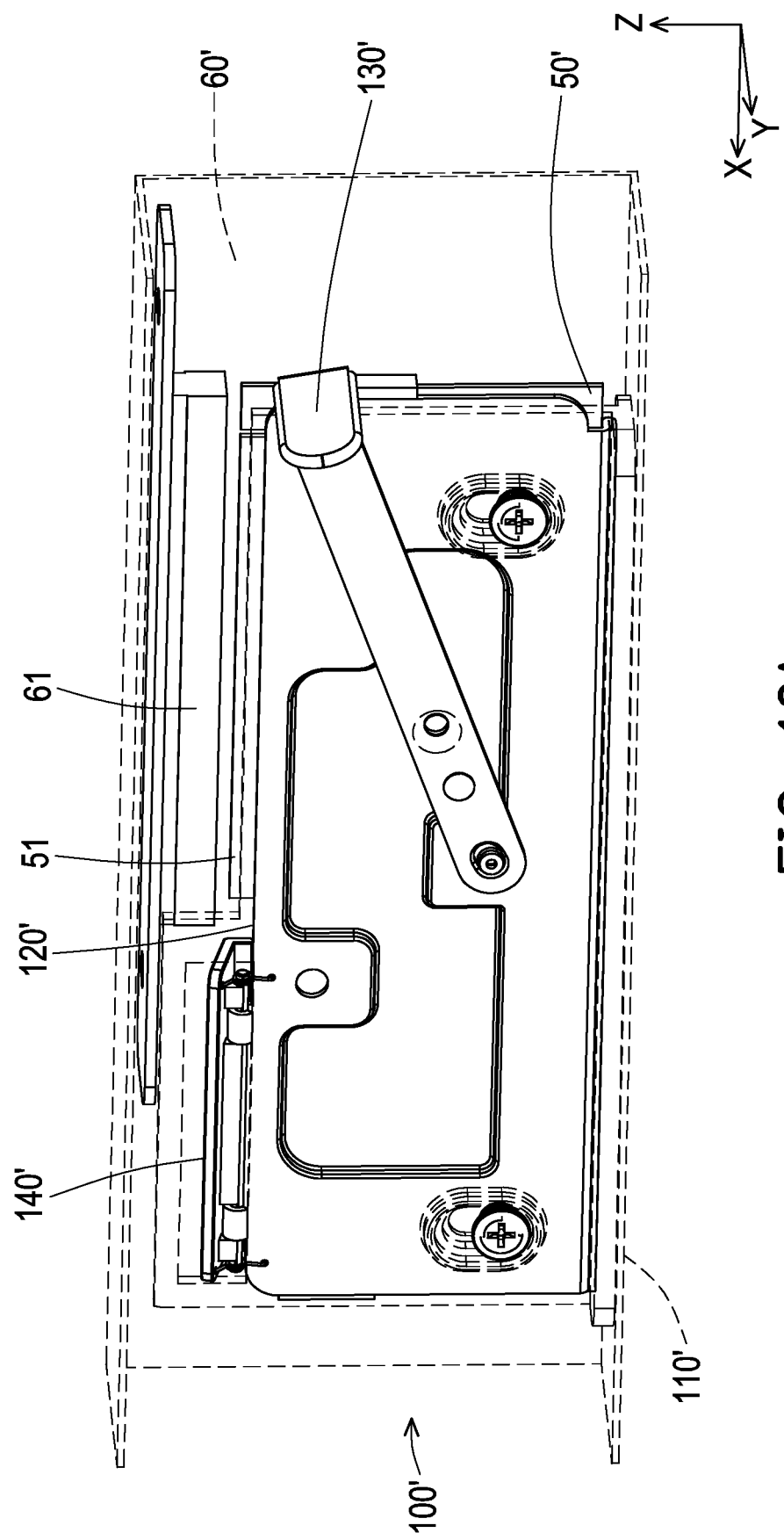
FIG. 12A and FIG. 12B show a manner of assembling the second object to the first object by using the assistant installation device of FIG. 11.
Figure 12B:
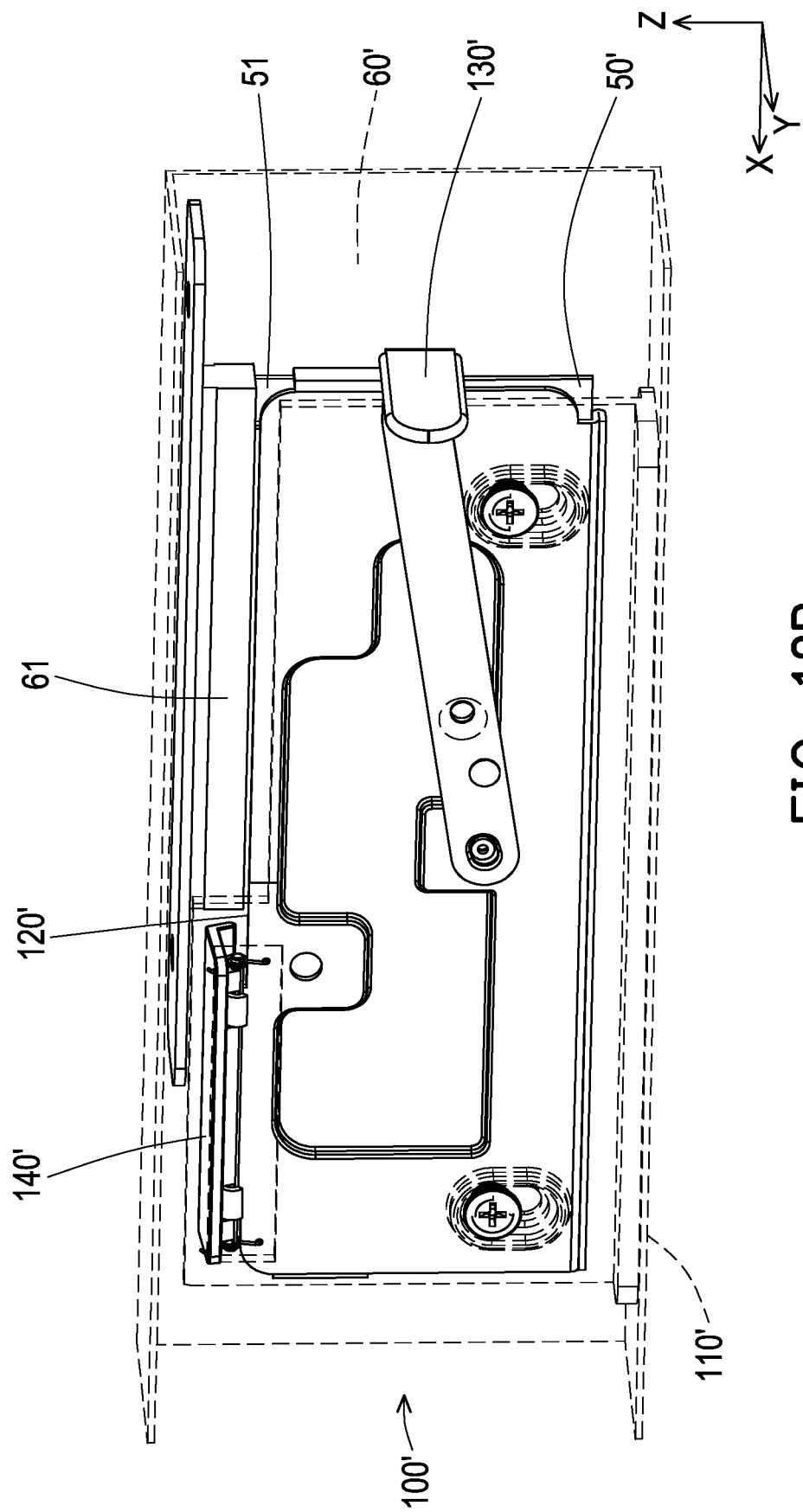

FIG. 11 is an exploded view of an assistant installation device, a second object, and a first object according to another embodiment of the disclosure. FIG. 12A and FIG. 12B show a manner of assembling the second object to the first object by using the assistant installation device of FIG. 11. The configuration and mode of action of components such as a base 110', a carrier 120', a handle 130', and a limiting member 140' of an assistant installation device 100' of FIG. 11 are substantially the same as the configuration and mode of action of components such as the base 110, the carrier 120, the handle 130, the limiting member 140 of the assistant installation device 100 of the above embodiment, and the difference is that the carrier 120' of the assistant installation device 100' is designed to be raised and lowered relative to the base 110' only along the first direction (the axial direction Z) and not move relative to the base 110' along the second direction (the axial direction Y). A second object 50' is, for example, an expansion card, a circuit board, and other objects that need to be plugged into a first object 60'. In the embodiment, the circuit board is used as an example for illustration. The assistant installation device 100' of the embodiment may be used for inserting/removing assembly of the circuit board (the second object 50') in a small space and/or requiring a relatively large inserting/removing force. With the raising of the carrier 120' relative to the base 110' as shown in FIG. 12A to FIG. 12B, a gold finger 51 of the circuit board (the second object 50') on the carrier 120' is inserted into a corresponding connector 61 on the first object 60'. In this way, the process of installing the second object 50' onto the first object 60' can be relatively effort saving and simple.

What is claimed is:

1. An assistant installation device, comprising:
    a base, adapted to be removably placed on a first object;
    a carrier, slidably disposed on the base and adapted to carry a second object;
    a handle, connected to the base and the carrier, wherein the handle is adapted to drive the carrier to move relative to the base, so that an assembling portion of the second object corresponds to an assembling portion of the first object; and
    a limiting member, wherein the limiting member is pivotally connected to the carrier and is adapted to rotate relative to the carrier to limit the second object or release the second object.

2. The assistant installation device according to claim 1, wherein the carrier is further slidably disposed on the base along a first direction and a second direction perpendicular to the first direction, and the handle is adapted to drive the carrier and the second object on the carrier to move away from the base along the first direction and the second direction, so that the assembling portion of the second object is assembled to the assembling portion of the first object.

3. The assistant installation device according to claim 2, wherein the base is provided with at least one convex portion, the carrier is provided with at least one concave portion, and the at least one convex portion is located in the at least one concave portion and is adapted to move along with the carrier relative to the base along the first direction to be moved away from the at least one concave portion and push against the carrier, so that the carrier moves away from the base along the second direction.

4. The assistant installation device according to claim 3, wherein the at least one convex portion is adapted to move along with the carrier relative to the base along the first direction to be moved away from the at least one concave portion after moving a predetermined stroke in the at least one concave portion.

5. The assistant installation device according to claim 1, wherein the base has at least one slot, the carrier comprises a frame and at least one connecting post, the frame is adapted to carry the second object, and the at least one connecting post is connected to the frame and movably penetrates the at least one slot.

6. The assistant installation device according to claim 5, comprising an elastic member, wherein the elastic member is compressibly disposed between the carrier and the base and sleeved on the at least one connecting post, and the carrier is adapted to reset toward the base by an elastic force of the elastic member.

7. The assistant installation device according to claim 1, wherein the handle is provided with a first pivoting portion, a second pivoting portion, and an operating portion, the first pivoting portion is located between the second pivoting portion and the operating portion and is pivotally connected to the base, and the second pivoting portion is pivotally connected to the carrier.

8. The assistant installation device according to claim 7, wherein a pivot axis of the first pivoting portion and a pivot axis of the second pivoting portion are parallel to each other.

9. The assistant installation device according to claim 7, wherein there is a gap between the base and the carrier, the handle is located in the gap, and the operating portion protrudes out of the gap.

10. The assistant installation device according to claim 1, comprising an elastic member, wherein the elastic member is disposed between the limiting member and the carrier, the limiting member is adapted to rotate to a first state by an elastic force of the elastic member to limit the second object, and the limiting member is adapted to resist the elastic force of the elastic member and rotate to a second state to release the second object.

11. The assistant installation device according to claim 10, wherein the base is provided with an opening, and the limiting member extends into the opening and is adapted to be pushed by an inner edge of the opening to rotate from the first state to the second state.

* * * * *